US009479149B1

United States Patent
Augustin et al.

(10) Patent No.: US 9,479,149 B1
(45) Date of Patent: Oct. 25, 2016

(54) OVERSHOOT COMPENSATION

(71) Applicant: Infineon Technologies AG, Neubiberg (DE)

(72) Inventors: Michael Augustin, Villach (AT);
Stefano Marsili, Faak am See (AT);
Dietmar Straeussnigg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/792,700

(22) Filed: Jul. 7, 2015

(51) Int. Cl.
*H03K 5/12* (2006.01)

(52) U.S. Cl.
CPC ...................... *H03K 5/12* (2013.01)

(58) Field of Classification Search
None
See application file for complete search history.

(56) References Cited

U.S. PATENT DOCUMENTS

| 4,134,074 A * | 1/1979 | Hershberger | H03G 5/18 327/113 |
| 4,704,642 A * | 11/1987 | Namiki | G11B 20/24 360/64 |
| 2014/0232473 A1 * | 8/2014 | Matsuda | H03L 7/091 331/8 |

* cited by examiner

*Primary Examiner* — Cassandra Cox
(74) *Attorney, Agent, or Firm* — Schiff Hardin LLP

(57) ABSTRACT

An overshoot compensation circuit for an input signal, having a slew rate detection circuit configured to detect a slew rate of the input signal; a run time circuit configured to initialize a predetermined run time when an absolute value of the slew rate of the input signal is greater than or equal to a predetermined threshold; and a low pass filter configured to decrease the slew rate of the input signal only during the predetermined run time.

20 Claims, 3 Drawing Sheets

OVERSHOOT COMPENSATION

BACKGROUND

In a digital decimation filter, a target frequency response is characterized by a flat pass-band region, which is in a frequency range where a signal of interest is located, and a stop-band region, which has a large attenuation in a frequency range where noise, aliases and interferers are present. A transition between the pass-band region and the stop-band region is ideally as sharp as possible.

A decimation filter may be used to observe whether a sensor output signal, which changes quickly between levels as in a step response, is above a critical threshold indicating an error condition. As can be seen in FIG. 2B, the step response has a large overshoot indicated by reference numeral 230, which could result in a false alarm. The overshoot is 8% higher than the true, final level, requiring that the threshold be set at least 10% higher than actually required.

DETAILED DESCRIPTION

The present disclosure is directed to a method and circuit for compensating for an overshoot of an output signal of a decimation filter by reducing the slew rate of the input signal only during the overshoot.

Figure 1:
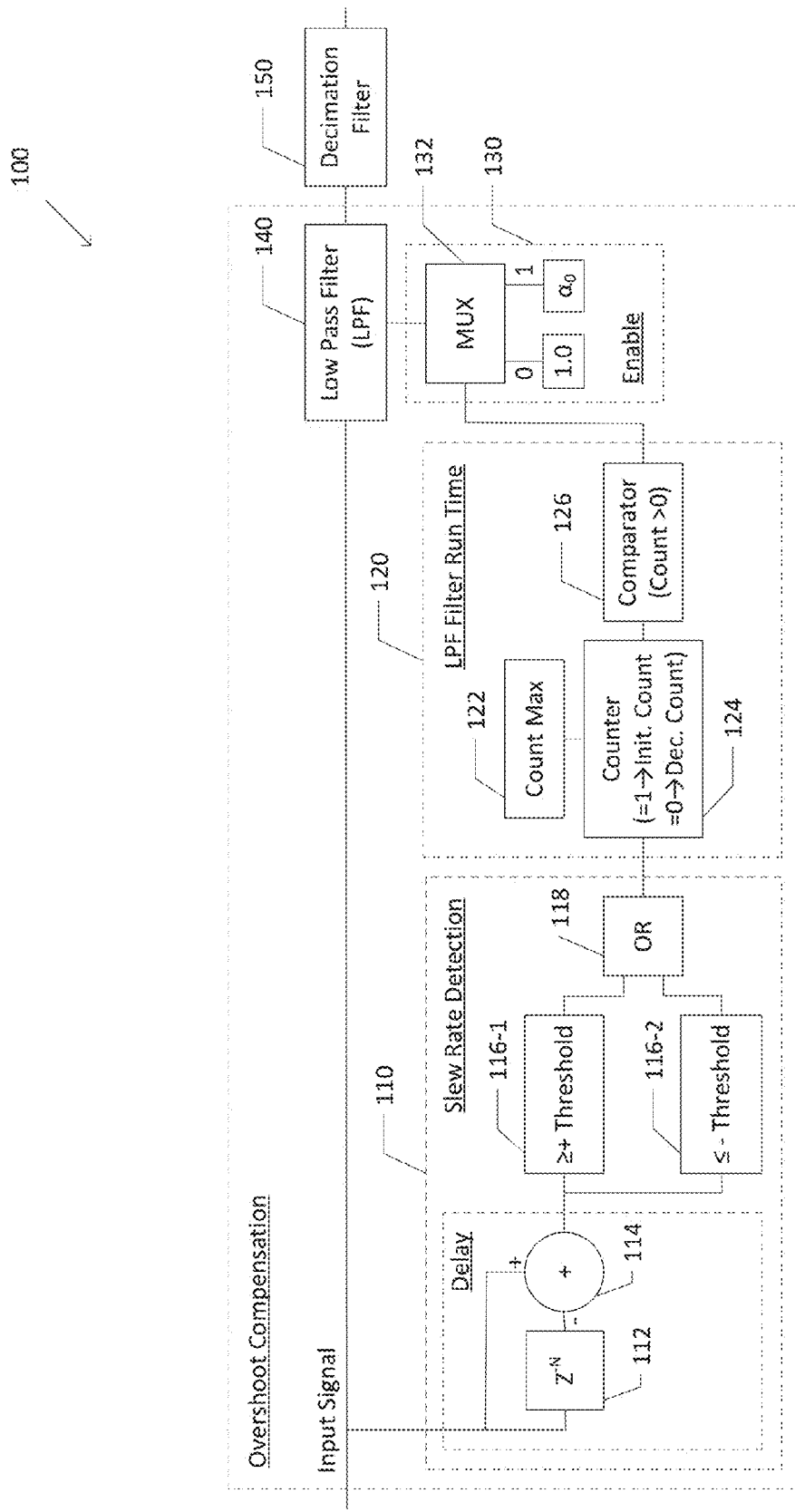
FIG. 1 illustrates a schematic diagram of a filter having an overshoot compensation circuit in accordance with an exemplary embodiment.

FIG. 1 illustrates a schematic diagram of a filter 100 having an overshoot compensation circuit for a digital input signal in accordance with an exemplary embodiment. The filter 100 comprises an overshoot compensation circuit, to be described in detail below, and a decimation filter (LPF) 150. The decimation filter 150, which reduces a sampling rate of the digital input signal, is known. This disclosure focuses on the overshoot compensation of the input signal provided to the decimation filter 150.

The overshoot compensation circuit comprises a slew rate detection circuit 110, a low pass filter (LPF) run time circuit 120, an enable circuit 130, and a LPF 140. By way of overview, the slew rate detection circuit 110 detects the slew rate of the input signal and determines whether an absolute value of the slew rate is greater than or equal to a predetermined threshold, in other words, whether an overshoot will appear at the output of the decimation filter 150. If there is an overshoot, the LPF run time circuit 120 sets the run time for the LPF 140. The run time is based on an expected length of the overshoot. The enable circuit 130 then enables the LPF 140 only for this run time during this overshoot to filter the input signal before it is filtered as it is normally by the decimation filter 150. More detailed explanations of these individual elements of the overshoot compensation circuit follow.

The slew rate detection circuit 110 is configured to detect a slew rate of the input signal and determine whether the slew rate is beyond or equal to a threshold. A slew rate, as is known, is the maximum rate of change of the input signal per unit of time. The slew rate detection circuit 110 comprises a delay circuit, a threshold detection circuit 116, and an OR gate 118.

The delay circuit is configured to determine the slew rate of the input signal. The delay circuit comprises a delay element 112 and a subtractor 114, and these elements together determine a slope or derivative of the input signal by performing a comparison between a current sample of the input signal and a previous sample in order to detect whether there was a step in the input signal. The delay element 112 is configured to store a previous N number of samples of the input signal to build the slope, where N is greater than or equal to 1. The subtractor 114 is configured to subtract the current sample of the input signal from N samples prior, and output the slew rate.

The value of N is design specific, and requires balancing speed and reliability. A large N results in more delay, and if too large, by the time N samples are collected, the overshoot may be over. Lowering the value of N results in a faster reaction, but too fast a reaction may result in false information.

The threshold determination circuit 116 is configured to determine whether an absolute value of the slew rate is greater than or equal to the predetermined threshold, and if so detects a too steep input signal which will cause unwanted overshoots or undershoots in the output signal of the decimation filter 150. The threshold determination circuit 116 comprises an overshoot threshold circuit 116-1 and an undershoot threshold circuit 116-2. If the change in the input signal is in the positive direction, the overshoot threshold circuit 116-1 determines whether the slew rate of the input signal is greater than or equal to a predetermined threshold. On the other hand, if the change is in the negative direction, the undershoot threshold circuit 116-2 determines whether the slew rate of the input signal is less than or equal to the predetermined threshold. Note that throughout the disclosure the term "overshoot" may be intended to generally mean overshoot or undershoot. In case the predetermined threshold is 0, the threshold detection circuit 116 interprets the input signal to be too steep at every point and activates the LPF 140 permanently.

The OR gate 118 receives the outputs of the overshoot threshold circuit 116-1 and of the undershoot threshold circuit 116-2. If either of these outputs is positive, that is, either the overshoot threshold circuit 116-1 determines that the slew rate of the input signal is greater than or equal to the predetermined threshold and will cause an overshoot in the output signal of the decimation filter 150, or when the undershoot threshold circuit 116-2 determines that the slew rate of the input signal is less than or equal to the predetermined threshold and will cause an undershoot in the output signal of the decimation filter 150, the OR gate 118 outputs a corresponding pulse.

The slew rate detection circuit 110 is merely an example. Its design may be modified as long as it remains suitable for its intended purpose.

The LPF run time circuit 120 is configured to initialize a predetermined run time of the LPF 140 when the absolute value of the slew rate of the input signal is greater than or equal to the predetermined threshold. In other words, when the input signal will cause an overshoot or undershoot at the output of the decimation filter 150, the LPF run time circuit 120 sets a run time for which the LPF 140 will be enabled to filter the input signal to compensate for the overshoot or undershoot at the output of the decimation filter 150.

The LPF run time circuit 120 comprises a maximum count register 122, a counter 124, and a comparator 126. The maximum count register 122 stores a maximum counter value representing a time required for the LPF 140 to compensate for the overshoot caused by the input signal. The counter 124 initiates a counter value to the maximum counter value when too steep an input signal (positive or negative) is detected, that is, when the slew rate of the input signal is greater than or equal to the absolute value of the predetermined threshold. The counter value is then decreased for each sample of the digital input signal until the counter reaches zero. If there is an additional overshoot before the counter reaches zero, the counter 124 re-initiates the counter value to the maximum counter value. The comparator 126 is configured to determine when the counter value is greater than zero.

The enable circuit 130 is configured to enable the LPF 140 to decrease a slew rate of the input signal for the predetermined run time. The enable circuit 130 comprises a multiplexer 132 having input lines 0 and 1 that are selected based on a received output from the comparator 126. If the output of the comparator 126 indicates that the counter value is greater than zero, the multiplexer 132 selects input 1 to enable the LPF 140 to filter the input signal (i.e., decrease the slew rate of the input signal) using a coefficient α. When the counter value is zero, the multiplexer 132 selects input 0 to disable the LPF 140. The LPF 140 is enabled only when the input signal will cause overshoots or undershoots. It is not desirable to enable the LPF 140 permanently because the LPF 140 produces additional delay and changes the frequency response of the filtered signal. However, it is possible to disable the LPF 140 by setting the threshold to 0.

The LPF 140 has a transfer function in accordance with the following equation:

$$y(n)=y(n-1)*(1-\alpha)+x(n)*(\alpha) \quad \text{(Equation 1)}$$

where x(n) is the input signal, y(n) is an output signal of the LPF 140, and a is a coefficient of the LPF 140 which defines its cut-off frequency. Based on the counter value, different coefficients α are applied to the LPF 140. When the counter is 0, then α=1 and no filtering is applied; the samples of the input signal transfer directly to the decimation filter 150. When the counter differs from 0, a desired α=α₀ is applied. Therefore, the LPF 140 applies additional filtering to the samples of the input signal for the time the counter is non-zero to thereby reduce the slew rate of the input signal at the input of the decimation filter 150. The smaller the value of α, the greater the amount the LPF 140 the filters the input signal. The specific value of α is a design choice based on what is known about the possible input signals.

The maximum counter value is set depending on a shape of the decimation filter 150 based on how many samples of the input signal an overshoot tends to last, for example, for four samples. The longer the LPF 140 is enabled, the greater the overshoot caused by the input signal is reduced. Alternatively, if the LPF 140 is enabled for a shorter period of time, the sooner it is possible to return to the normal decimation filter 150 operation without the filtering by the LPF 140.

The LPF 140 may alternatively be a comb filter, or any other filter suitable for the intended purpose. Also, in an alternative embodiment there is no separate enable circuit 130 with multiplexer 132; instead the output from the comparator 126 is sent directly to the LPF 140.

Figure 2A:
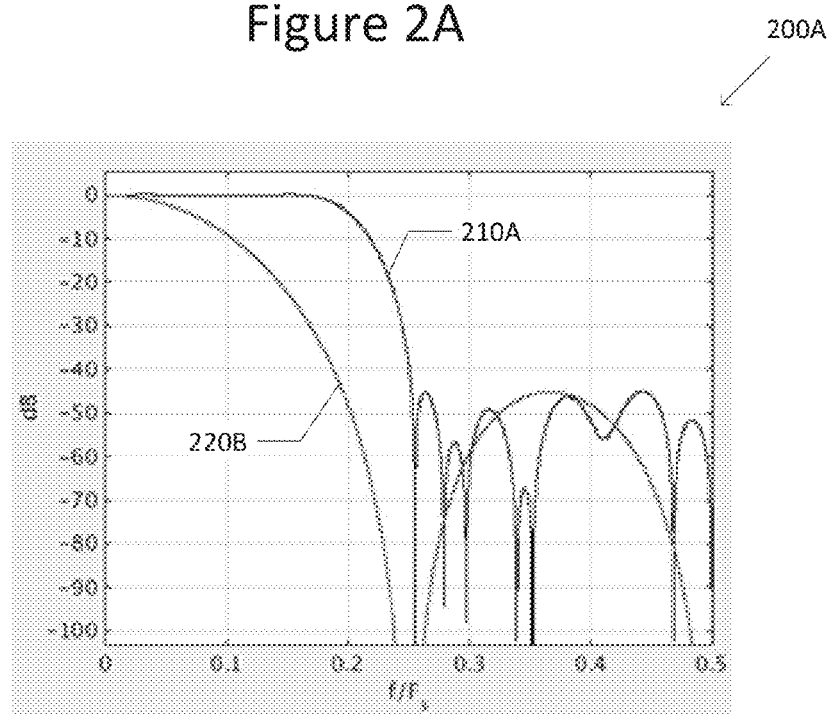
FIG. 2A illustrates a graph of filter frequency responses.
Figure 2B:
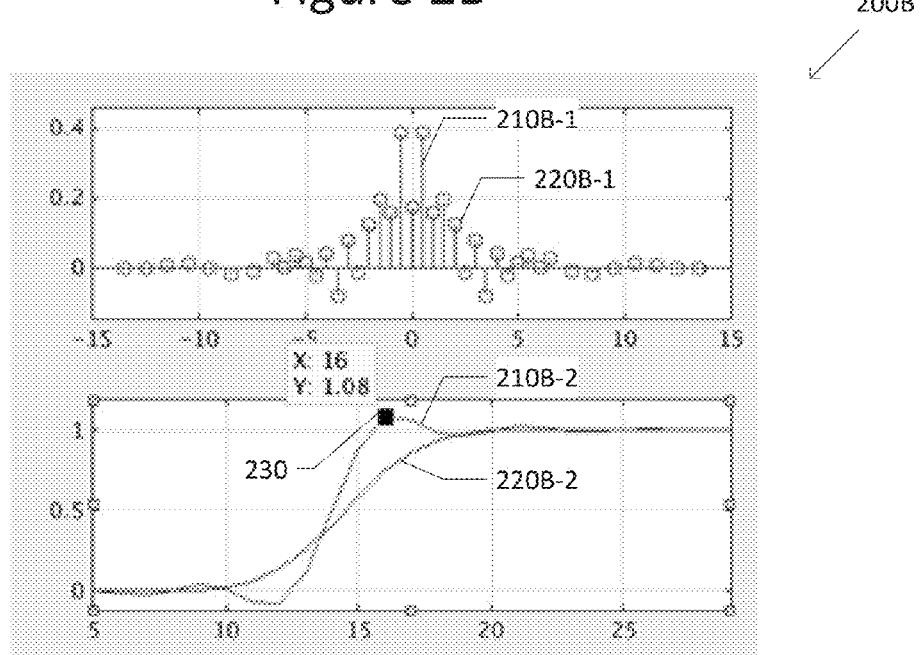
FIG. 2B illustrates a graph of decimation filter impulse responses and a graph of decimation filter step responses.

FIG. 2A illustrates a graph 200A of frequency responses of the decimation filter 150; the x-axis represents frequency, and the y-axis represents decibels. FIG. 2B illustrates graphs 200B of decimation filter impulse responses and of decimation filter step responses; the x-axes of the graphs represent normalized time, and the y-axes represent normalized amplitudes.

Curve 210A is a desired filter frequency response with a flat in-band and attenuation outside of the in-band starting at a cut-off frequency. The impulse response of this filter is represented by curve 210B-1, and the step response of this filter is represented by curve 210B-2. Unfortunately the step response 210B-2 has an overshoot 230.

Curve 220B is not as desirable as curve 210A in that the in-band decreases quickly due to early attenuation. However, as the impulse response 220B-1 and the step response 220B-2 show, there is no undesired overshoot.

Ideally, a filter results in frequency response having curve 210A without the overshoot 230. As this disclosure explains, if an overshoot condition is detected by the overshoot compensation circuit, the LPF 140 filters the input signal for a short period of time during the overshoot in the direction of the curve 220B (i.e., 220B-1 and 220B-2), and after the overshoot finishes returns back to the curve 210A (i.e., 210B-1 and 210B-2).

Figure 3:
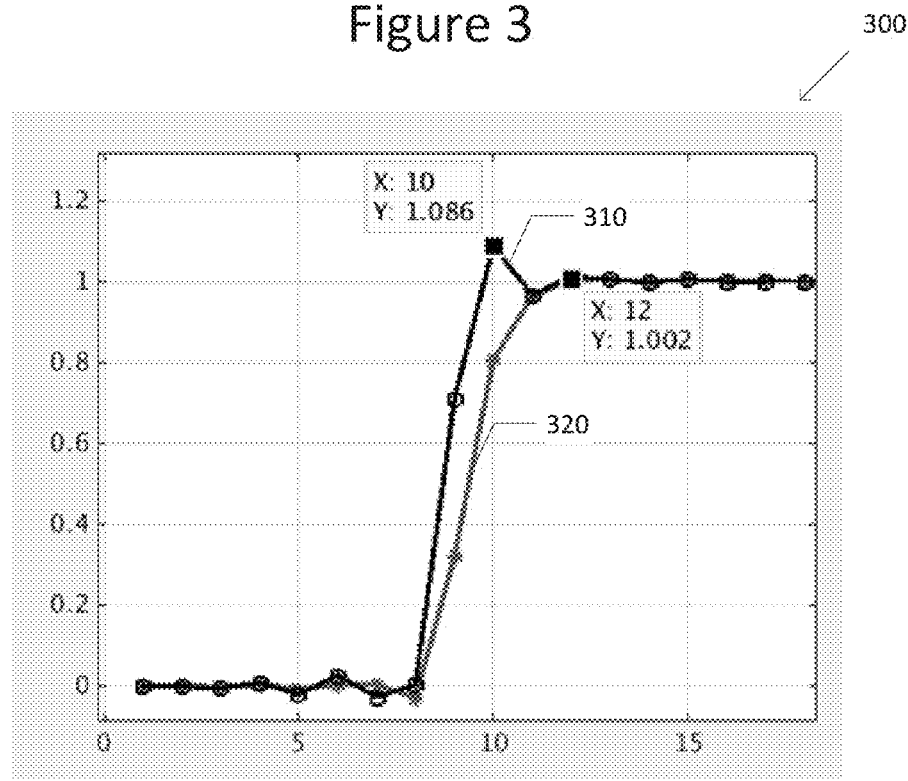
FIG. 3 illustrates a graph of decimation filter step responses.

FIG. 3 illustrates a graph 300 of step responses of the decimation filter 150. Curve 310 represents a step response of the decimation filter 150 without the benefit of the overshoot compensation circuit of this disclosure. On the other hand, curve 320 represents a step response of the decimation filter 150 with the filtering by the overshoot compensation circuit. As can be seen, the overshoot compensation circuit reduces the overshoot caused by the input signal.

Figure 4:
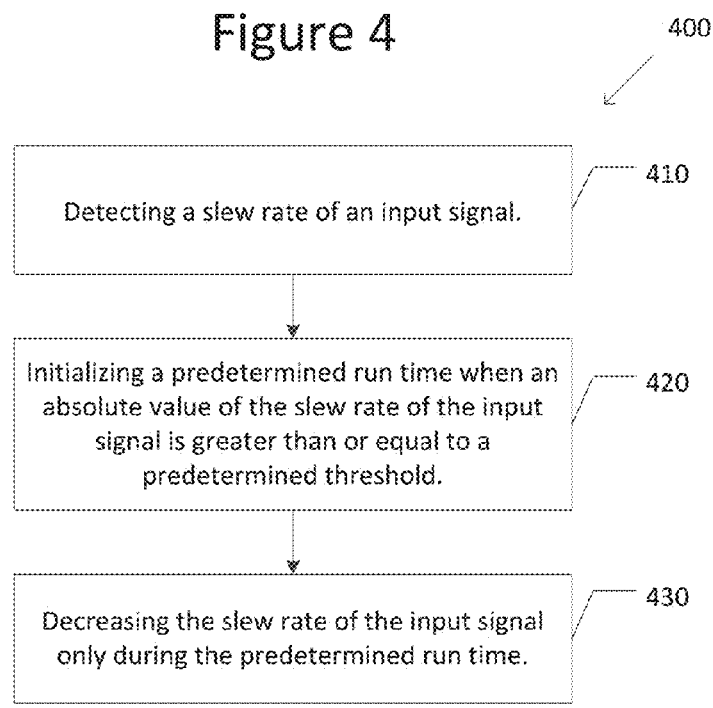
FIG. 4 illustrates a flowchart of a method for compensating for input signal overshoot in accordance with an exemplary embodiment.

FIG. 4 illustrates a flowchart 400 of a method for compensating for an overshoot caused by an input signal in accordance with an exemplary embodiment.

In Step 410, the slew rate detection circuit 110 detects a slew rate of the input signal.

In Step 420, the run time circuit initializes the predetermined run time when an absolute value of the slew rate of the input signal is greater than or equal to the predetermined threshold.

At Step 430, the LPF 140 decreases the slew rate of the input signal only for the predetermined run time during the overshoot.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. An overshoot compensation circuit for an input signal, comprising:
    a slew rate detection circuit configured to detect a slew rate of the input signal;

a run time circuit configured to initialize a predetermined run time when an absolute value of the slew rate of the input signal is greater than or equal to a predetermined threshold; and a low pass filter configured to decrease the slew rate of the input signal only during the predetermined run time.

2. The overshoot compensation circuit of claim 1, wherein the low pass filter has a transfer function as follows:

$$y(n)=y(n-1)*(1-\alpha)+x(n)*(\alpha),$$

where x(n) is the input signal, y(n) is an output signal of the low pass filter, and $\alpha$ is a coefficient of the low pass filter.

3. The overshoot compensation circuit of claim 1, wherein the low pass filter is a comb filter.

4. The overshoot compensation circuit of claim 1, wherein the run time circuit comprises:

a counter configured to initiate a counter value to a maximum counter value corresponding to the predetermined run time when the absolute value of the slew rate of the input signal is greater than or equal to the predetermined threshold, and to decrease the counter value for each sample of the input signal.

5. The overshoot compensation circuit of claim 4, wherein the run time circuit further comprises:

a comparator configured to determine when the counter value is greater than zero.

6. The overshoot compensation circuit of claim 5, further comprising:

a multiplexer configured to enable the low pass filter to decrease the slew rate of the input signal only while the counter value is greater than zero.

7. The overshoot compensation circuit of claim 6, wherein the multiplexer is configured to disable the low pass filter when the counter value is equal to zero.

8. The overshoot compensation circuit of claim 1, wherein the slew rate detection circuit comprises:

a delay circuit configured to determine the slew rate of the input signal; and a threshold determination circuit configured to determine whether the absolute value of the slew rate is greater than or equal to the predetermined threshold.

9. The overshoot compensation circuit of claim 8, wherein the delay circuit comprises:

a delay element configured to store a previous N number of samples of the input signal, where N is greater than or equal to 1; and a subtractor configured to subtract the previous N samples of the input signal from a current sample of the input signal.

10. A filter, comprising:

the overshoot compensation circuit of claim 1; and a decimation low pass filter configured to filter the low pass filtered input signal.

11. A method for compensating for an overshoot caused by an input signal, comprising:

detecting, by a slew rate detection circuit, a slew rate of the input signal;

initializing, by a run time circuit, a predetermined run time when an absolute value of the slew rate of the input signal is greater than or equal to a predetermined threshold; and decreasing, by a low pass filter, the slew rate of the input signal only during the predetermined run time.

12. The method of claim 11, wherein the low pass filter has a transfer function as follows:

$$y(n)=y(n-1)*(1-\alpha)+x(n)*(\alpha),$$

where x(n) is the input signal, y(n) is an output signal of the low pass filter, and $\alpha$ is a time constant of the low pass filter.

13. The method of claim 11, wherein the low pass filter is a comb filter.

14. The method of claim 11, further comprising:

initiating, by a counter of the run time circuit, a counter value to a maximum counter value corresponding to the predetermined run time when the absolute value of the slew rate of the input signal is greater than or equal to the predetermined threshold; and decreasing, by the run time circuit, the counter value for each sample of the input signal.

15. The method of claim 14, further comprising:

determining, by a comparator of the run time circuit, when the counter value is greater than zero.

16. The method of claim 15, further comprising:

enabling, by a multiplexer, the low pass filter to decrease the slew rate of the input signal only while the counter value is greater than zero.

17. The method of claim 16, further comprising:

disabling, by the multiplexer, the low pass filter when the counter value is equal to zero.

18. The method of claim 11, further comprising:

determining, by a delay circuit of the slew rate detection circuit, the slew rate of the input signal; and determining, by a threshold determination circuit of the slew rate detection circuit, whether the absolute value of the slew rate is greater than or equal to the predetermined threshold.

19. The method of claim 18, further comprising:

storing, by a delay element of the delay circuit, a previous N number of samples of the input signal, where N is greater than or equal to 1; and subtracting, by a subtractor of the delay circuit, the previous N samples of the input signal from a current sample of the input signal.

20. An overshoot compensation circuit for an input signal, comprising:

a slew rate detection means for detecting a slew rate of the input signal;

a run time means for initializing a predetermined run time when an absolute value of the slew rate of the input signal is greater than or equal to a predetermined threshold; and a low pass filter means for decreasing the slew rate of the input signal only during the predetermined run time.

* * * * *